US012667007B2

(12) United States Patent
Hong et al.

(10) Patent No.: US 12,667,007 B2
(45) Date of Patent: Jun. 23, 2026

(54) DIODE AND BIPOLAR JUNCTION TRANSISTOR FOR 3D SFET WITH BSPDN STRUCTURE

(71) Applicant: SAMSUNG ELECTRONICS CO., LTD., Suwon-si (KR)

(72) Inventors: Byounghak Hong, Albany, NY (US); Wookhyun Kwon, Hwaseong-si (KR); Jaehong Lee, Albany, NY (US)

(73) Assignee: SAMSUNG ELECTRONICS CO., LTD. (KR)

( * ) Notice: Subject to any disclaimer, the term of this patent is extended or adjusted under 35 U.S.C. 154(b) by 662 days.

(21) Appl. No.: 17/969,402

(22) Filed: Oct. 19, 2022

(65) Prior Publication Data

US 2023/0411353 A1      Dec. 21, 2023

Related U.S. Application Data

(60) Provisional application No. 63/353,988, filed on Jun. 21, 2022.

(51) Int. Cl.
| | |
|---|---|
| *H01L 25/065* | (2023.01) |
| *H01L 23/528* | (2006.01) |
| *H10D 88/00* | (2025.01) |
| *H10D 89/60* | (2025.01) |
| *H10W 20/41* | (2026.01) |
| *H10W 90/00* | (2026.01) |

(52) U.S. Cl.
CPC ............ *H10W 90/00* (2026.01); *H10D 88/00* (2025.01); *H10D 89/711* (2025.01); *H10W 20/427* (2026.01)

(58) Field of Classification Search
CPC ............. H01L 25/0657; H01L 23/5286; H01L 27/0688; H10W 80/314; H10W 80/312; H10W 90/00; H10W 90/701
See application file for complete search history.

(56) References Cited

U.S. PATENT DOCUMENTS

| | | | |
|---|---|---|---|
| 9,991,254 B1 | 6/2018 | Cheng et al. | |
| 10,290,725 B2 | 5/2019 | Chu et al. | |
| 10,971,490 B2 * | 4/2021 | Zhou .................... | H01L 29/6656 |
| 2020/0119170 A1 * | 4/2020 | Ok ....................... | H01L 29/1004 |
| 2020/0402984 A1 * | 12/2020 | Reznicek ............... | H10B 43/35 |
| 2021/0134802 A1 * | 5/2021 | Gomes ................ | H01L 29/7827 |
| 2021/0296315 A1 * | 9/2021 | Lilak ...................... | H10D 84/85 |
| 2021/0376137 A1 | 12/2021 | Yang et al. | |
| 2022/0077140 A1 | 3/2022 | Thomson et al. | |
| 2022/0102537 A1 | 3/2022 | Su et al. | |
| 2022/0113199 A1 | 4/2022 | Su et al. | |
| 2023/0326926 A1 * | 10/2023 | Kwon .................... | H10D 30/43 |

\* cited by examiner

*Primary Examiner* — Dale E Page
*Assistant Examiner* — Wilner Jean Baptiste
(74) *Attorney, Agent, or Firm* — Myers Bigel, P.A.

(57) ABSTRACT

A (3D) stacked field effect transistors (SFETs) device includes a first transistor structure including a first source/drain (S/D) region and a second S/D region, the second S/D region including a first side and a second side facing opposite to the first side, and a second transistor structure including a third S/D region and a fourth S/D region, the fourth S/D region including a first side and a second side facing opposite to the first side. The first transistor structure and the second transistor structure are merged such that the second side of the second S/D region is merged with the first side of the fourth S/D region.

21 Claims, 7 Drawing Sheets

DIODE AND BIPOLAR JUNCTION TRANSISTOR FOR 3D SFET WITH BSPDN STRUCTURE

CROSS-REFERENCE TO RELATED APPLICATION(S)

This application is based on and claims priority under 35 U.S.C. § 119 to U.S. Provisional Application No. 63/353,988, filed on Jun. 21, 2022, the disclosure of which is incorporated herein by reference in its entirety.

BACKGROUND

1. Field

Apparatuses and methods consistent with example embodiments of the disclosure relate to three dimensional (3D) stacked field effect transistors (SFETs) implemented in a backside power distribution network (BSPDN).

2. Description of Related Art

In an effort to enhance performance and device density of a semiconductor device, a multi-stack or three-dimensional-stack semiconductor device (hereafter, collectively "multi-stack semiconductor device") has been developed. For example, two field-effect transistors may be formed at a lower stack and an upper stack, respectively, to constitute a multi-stack semiconductor device. Here, the lower-stack field-effect transistor and the upper-stack field-effect transistor may each be a gate-all-around (GAA) transistor such as a fin field-effect transistor (FinFET) or a nanosheet transistor which is also referred to as multi-bridge channel field-effect transistor (MBCFET).

FIG. 1 illustrates an example three dimensional (3D) stacked field effect transistor (SFET). Referring to FIG. 1, a top p-type transistor structure may include a first source/drain (S/D) region 102 and a second S/D region 104. A bottom n-type transistor structure may include a first S/D region 106 and a second S/D region 108. The SFET of FIG. 1 may include various connections, such as a Vdd connection, ground (GND) connection, Vout connection, etc. The second S/D region 104 of the top p-type transistor structure may be connected to the second S/D region 108 of the bottom n-type transistor structure via a PN connection 110. Further, a gate structure MG surrounds an upper channel structure, the upper channel structure connecting the first S/D region 102 and the second S/D region 104 to each other in the top p-type transistor structure, and a lower channel structure connecting the first S/D region 106 and the second S/D region in the bottom n-type transistor structure.

However, as a plurality of connections or contact structures connecting the lower-stack field-effect transistor and the upper-stack field-effect transistor to power sources and other circuit elements are also required in completing the multi-stack semiconductor device, the structure of the multi-stack semiconductor device itself and a manufacturing process thereof become more complicated and expose various challenges.

Recently, research to disperse the complexity of back-end-of-line (BEOL) structures using a backside power distribution network (BSPDN) has been actively conducted. However, in the case of such BSPDN, while area efficiency may be expected from the BEOL perspective, there is a disadvantage in that a bulk silicon (Si) on a backside of a wafer (i.e., substrate) of the multi-stack semiconductor device must be thinned. As a result, it becomes difficult to secure a space for ion implantation on the bulk Si region of the backside of the wafer to form a bipolar junction transistor (BJT) or a passive device such as a diode when the BSPDN structure is used in the multi-stack semiconductor device.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides three dimensional (3D) stacked field effect transistors (SFETs) implemented in a backside power distribution network (BSPDN).

According to an aspect of an example embodiment, a 3D SFET device may include a first transistor structure including a first source/drain (S/D) region and a second S/D region, the second S/D region including a first side and a second side facing opposite to the first side, and a second transistor structure including a third S/D region and a fourth S/D region, the fourth S/D region including a first side and a second side facing opposite to the first side. The first transistor structure and the second transistor structure may be merged such that the second side of the second S/D region is merged with the first side of the fourth S/D region.

According to an aspect of an example embodiment, a 3D SFET device may include a first transistor structure including a first S/D region and a second S/D region, where the second S/D region includes a first side, a second side facing opposite to the first side, a base region, and an emitter electrode, and a second transistor structure including a third S/D region and a fourth S/D region, the fourth S/D region including a first side and a second side facing opposite to the first side. The first transistor structure and the second transistor structure may be merged such that the second side of the second S/D region is merged with the first side of the fourth S/D region, a first surface of the base region may be substantially coplanar with a first surface of the emitter electrode, and the first surface of the base region and the first surface of the emitter electrode may face opposite to a surface of the second side of the second S/D region.

According to an aspect of an example embodiment, a 3D SFET device may include a first transistor structure including a first S/D region and a second S/D region, where the second S/D region includes a first side, a second side facing opposite to the first side, and a base region, an emitter electrode, and a second transistor structure including a third S/D region and a fourth S/D region, where the fourth S/D region includes a first side, a second side facing opposite to the first side and a collector electrode. The first transistor structure and the second transistor structure may be merged such that the second side of the second S/D region is merged with the first side of the fourth S/D region, and the fourth S/D region may include an overlapping section that is merged with the second side of the second S/D region, a non-overlapping region, and a metal shim provided on the non-overlapping section.

Example embodiments of the disclosure will be more clearly understood from the following detailed description taken in conjunction with the accompanying drawings in which.

BRIEF DESCRIPTION OF THE DRAWINGS

The above and other aspects, features, and aspects of embodiments of the disclosure will be more apparent from the following description taken in conjunction with the accompanying drawings, in which.

DETAILED DESCRIPTION

Figure 1:
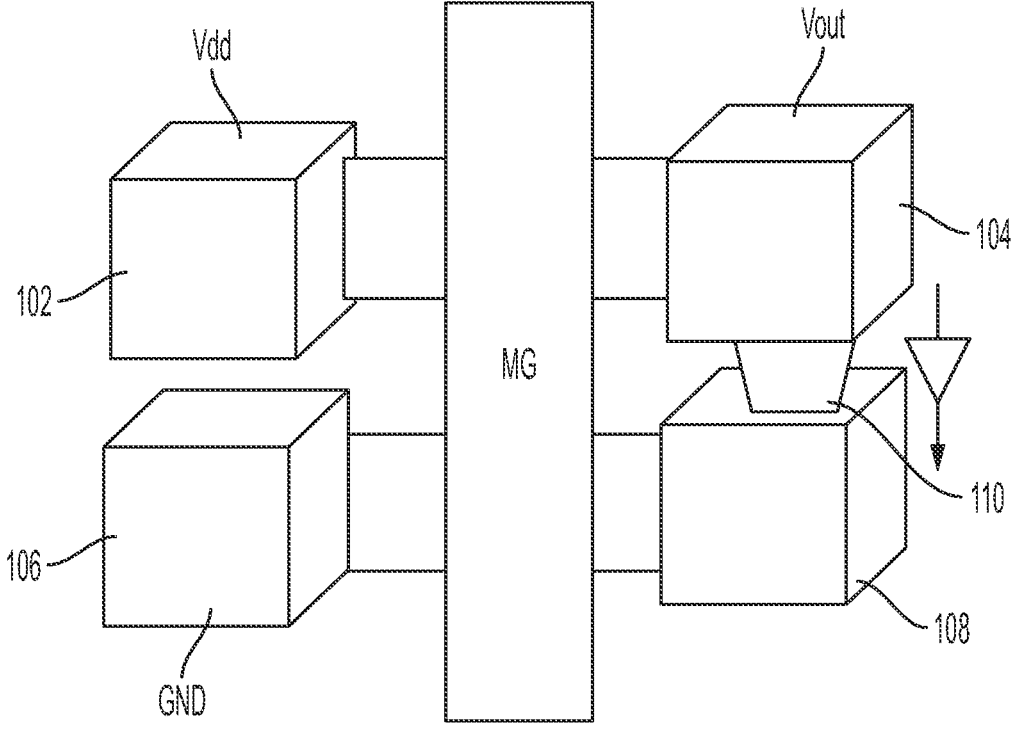
FIG. 1 illustrates an example three dimensional (3D) stacked field effect transistor (SFET)

The following detailed description of example embodiments refers to the accompanying drawings. The same reference numbers in different drawings may identify the same or similar elements.

The embodiments of the disclosure described herein are example embodiments, and thus, the disclosure is not limited thereto, and may be realized in various other forms. Each of the embodiments provided in the following descriptions is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a material or materials forming a metal line or a via may not be limited to metals of which examples are taken herein as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element in the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there may be no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

It is understood that, in the descriptions below and the accompanying drawings, an element, component, layer, pattern, structure or region indicated by same reference numbers or reference characters in various embodiments may refer to the same or different element, component, layer, pattern, structure or region.

Provided herein is a transistor structure that uses a backside power distribution network (BSPDN) as well as a three dimensional (3D) stacked field effect transistor (SFET) which avoids the limitation to forming a bipolar junction transistor (BJT) or diode structure on a backside of a substrate on which transistor structures are formed.

Figure 2:
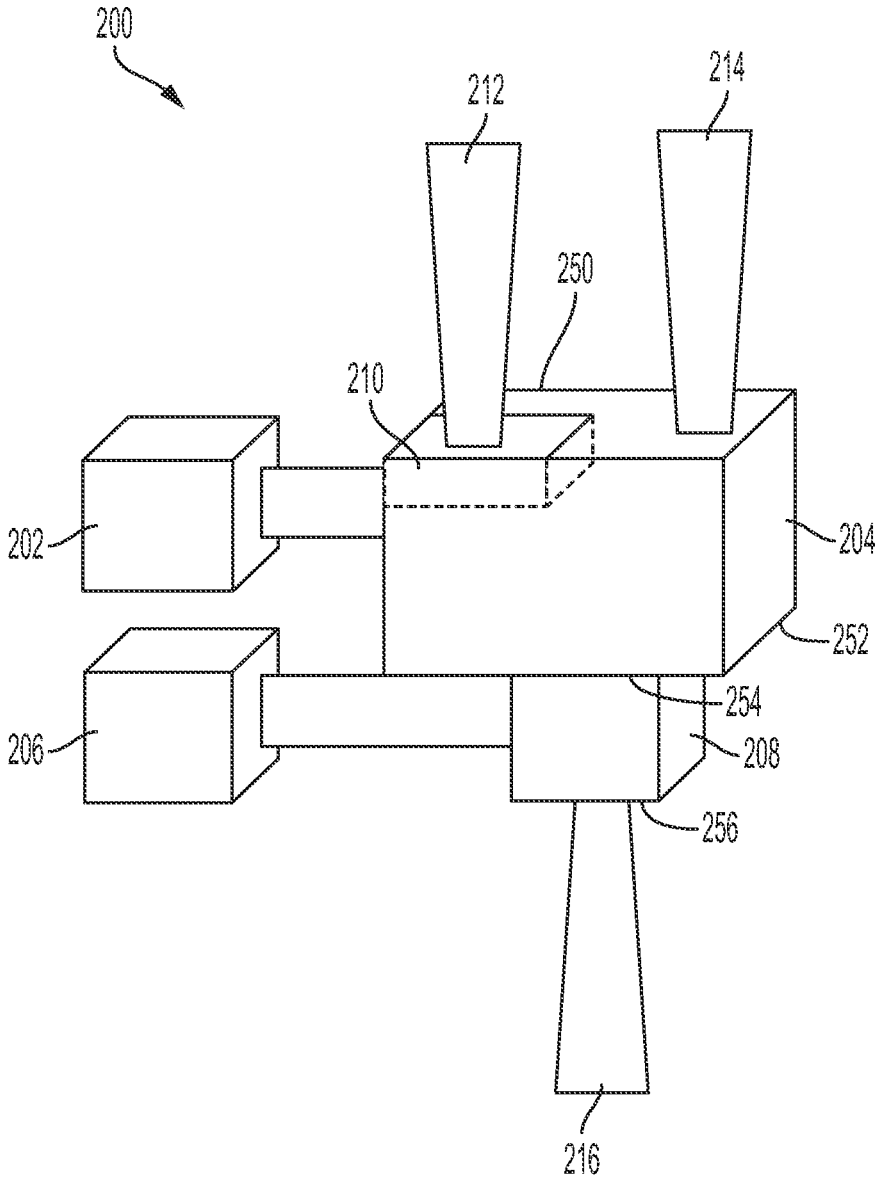
FIG. 2 illustrates a 3D SFET structure, according to an embodiment.

FIG. 2 illustrates a 3D SFET structure 200, according to an embodiment. The SFET structure 200 may include a first transistor structure having a first source/drain (S/D) region 202 and a second S/D region 204, and a second transistor structure having a third S/D region 206 and a fourth S/D region 208. The first transistor structure and the second transistor structure may include nanosheet SFETs. The first transistor structure may be configured as a top transistor structure, the second transistor structure may be configured as a bottom transistor structure, or the arrangement/orientation of the transistor structures may be reversed.

The first transistor structure may have a different polarity than the second transistor structure. For example, when the first transistor structure is p-type, the second transistor structure may be n-type, and vice versa. That is, when the first transistor structure is p-type, the first S/D region 202 and the second S/D region 204 of the first transistor structure are p-type, and the third S/D region 206 and the fourth S/D region 208 of the second transistor structure are n-type (and vice versa). The polarities may further vary. While the second S/D region 204 and the fourth S/D region 208 may have different polarities, the first S/D region 202 and the third S/D region 206 may also have different polarities.

The fourth S/D region 208 may form a collector electrode (also referred to herein as a collector) and the second S/D region 204 may form a base region. The base region 204 may also include an emitter electrode 210 (also referred to herein as an emitter), in which a surface of the emitter 210 (e.g., a top surface or bottom surface) is coplanar with a surface of the base region 504 (e.g., a top surface or bottom surface respectively corresponding to the surface of the emitter 210). According to an embodiment, the emitter 210 may be formed by doping or implanting one or more p-type or n-type dopants on a portion of the second S/D region (base region) 204. The emitter 210 may have a different polarity than the base region 204. For example, when the base region 204 is a p-type base region, the emitter 210 may be an n-type electrode.

The SFET structure 200 may include a first contact 212, a second contact 214 and a third contact 216. The first contact 212 may be a middle-of-line (MOL) contact that contacts the emitter 210, the second contact 214 may be an MOL contact that contacts the base region 204, and the third contact 216 may be a BSPDN contact that contacts the fourth S/D region 208 (i.e., the collector 208). In some embodiments where the arrangement/orientation depicted in FIG. 2 is reversed (e.g., the first transistor structure being positioned below the second transistor structure), the first contact 212 may be a BSPDN contact that contacts the emitter 210, the second contact 214 may be a BSPDN that contacts the base region 204, and the third contact 216 may be an MOL contact that contacts the fourth S/D region 208 (i.e., the collector 208). That is, depending on the arrangement/orientation of the SFET structure 200, the contacts 212 and 214 may be either BSPDN contacts or MOL contacts. Furthermore, contact 216 may be a BSPDN contact when contacts 212 and 214 are MOL contacts, and contact 216 may be a MOL contact when contacts 212 and 214 are BSPDN contacts. However, the disclosure is not limited to these contact configurations. The contacts 212, 214 and 216 may connect the emitter 210, the base region 204 and the fourth S/D region 208 to various signals, such as Vdd, Vout, ground (GND), and other signals as will be understood by one of ordinary skill in the art from the disclosure herein. Furthermore, the contacts 212 and 214 may contact the emitter 210 and the base region 204, respectively, at the same height, as the surface of the emitter 210 is substantially coplanar with the surface of the base region 204.

The second S/D region 204 may include a first side 250 and a second side 252 facing opposite to the first side 250.

The fourth S/D region 208 may include a first side 254 and a second side 256 facing opposite to the first side 254. The first transistor structure may be merged with the second transistor structure, such that, as shown in FIG. 2, the second side 252 of the S/D region 204 may be merged with the first side 254 of the fourth S/D region 208.

For example, a surface of the collector 208 may be directly merged with a surface of the base region 204 to combine the first transistor structure with the second transistor structure, such that the merged collector 208 and base region 204 along with the emitter 210 forms a BJT. For example, a surface of the collector 208 (e.g., the top surface) may be merged (e.g., attached, affixed, formed with, adhered, electrically connected, etc.) with a surface of the base region 204 (e.g., a surface of the base region 204 corresponding to the second side of the second S/D region 204 may be merged at a surface of the collector 208 corresponding to the first side of the fourth S/D region 208).

As shown in FIG. 2, the formation of the second transistor structure may be largely unchanged versus conventional formations. However, the second S/D region 204 may be greatly expanded through, for example, increasing an amount of epitaxial growth to form the base region of the BJT, such that the second S/D region 204 with which the fourth S/D region 208 is merged may have a larger volume and larger surface area than that of the fourth S/D region 208. The enlarged size of the second S/D region 204 may allow for additional electrodes or passive device structures to be formed using the second S/D region 204.

Figure 3:
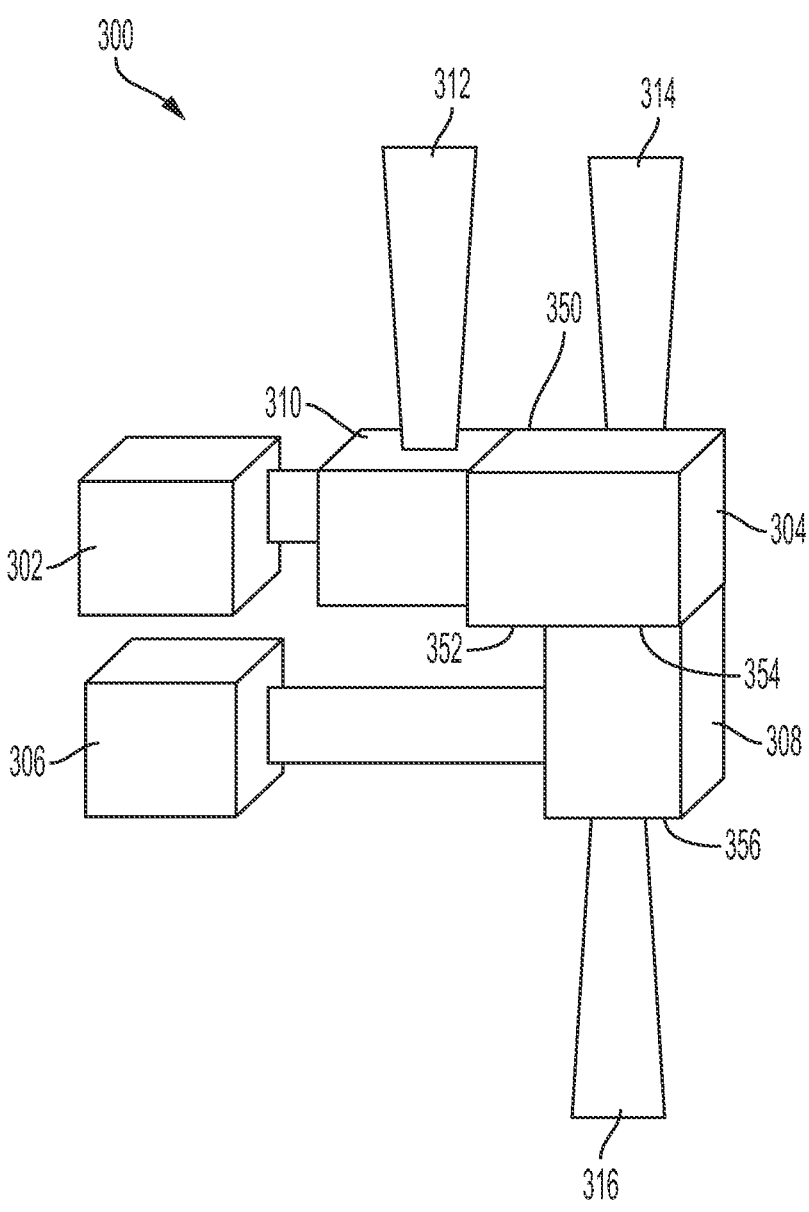
FIG. 3 illustrates a 3D SFET structure, according to an embodiment.

FIG. 3 illustrates a 3D SFET structure 300, according to an embodiment. The SFET structure 300 may include a first transistor structure having a first S/D region 302 and a second S/D region 304 and a second transistor structure having a third S/D region 306 and a fourth S/D region 308. The second S/D region 304 may include a first side 350 and a second side 352 facing opposite to the first side 350. The fourth S/D region 308 may include a first side 354 and a second side 356 facing opposite to the first side 354. The first transistor structure may be merged with the second transistor structure, such that, as shown in FIG. 3, the second side 352 of the S/D region 304 may be merged with the first side 354 of the fourth S/D region 308. The 3D SFET structure 300 includes some similarities to the 3D SFET structure 200 and repeated descriptions will be omitted.

Furthermore, as described with respect to the 3D SFET structure 200, the 3D SFET structure 300 arrangement/orientation may be reversed (e.g., the first transistor structure being positioned below the second transistor structure). In such embodiments, the first contact 312 may be a BSPDN contact that contacts the emitter 310, the second contact 314 may be a BSPDN that contacts the base region 304, and the third contact 316 may be an MOL contact that contacts the fourth S/D region 308 (i.e., the collector 308). That is, depending on the arrangement/orientation of the SFET structure 300, the contacts 312 and 314 may be either BSPDN contacts or MOL contacts. Furthermore, contact 316 may be a BSPDN contact when contacts 312 and 314 are MOL contacts, and contact 316 may be a MOL contact when contacts 312 and 314 are BSPDN contacts. However, the disclosure is not limited to these contact configurations.

The second S/D region 304 may form a base region, and the fourth S/D region 308 may form a collector electrode. Additionally, an emitter electrode 310 may be extended over a channel region of the first transistor structure. That is, the emitter 310 may be positioned external to the base region 304. The emitter 310 may have a different polarity from the base region 304 (e.g., when the emitter 310 is p-type, the base region 304 may be n-type and vice versa). A surface of the emitter 310 (e.g., the top surface of the emitter 310) may be substantially coplanar with a surface of the base region 304 (e.g., a top surface of the base region 304), such that contacts 312 and 314 (which may be similar to contacts 212 and 214) are connected to the emitter 310 and the base region 304 at substantially the same height.

Figure 4:
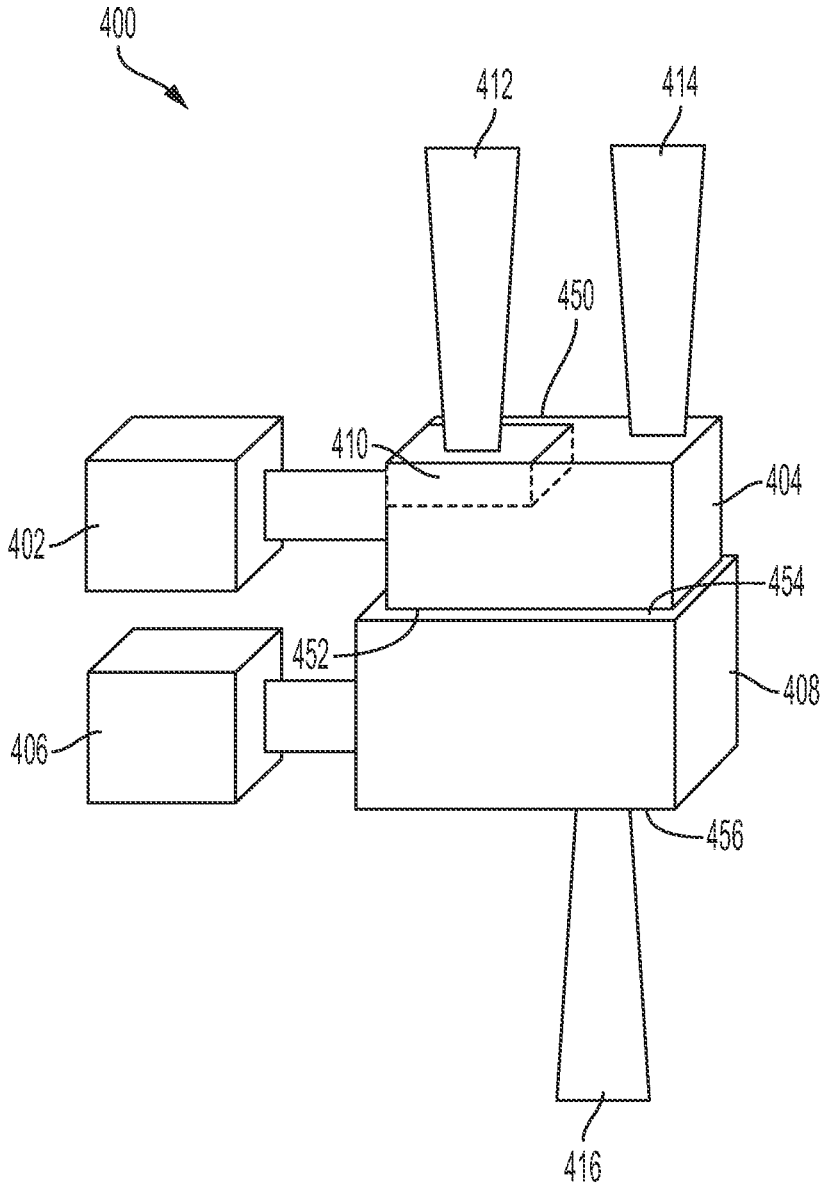
FIG. 4 illustrates a 3D SFET structure, according to an embodiment.

FIG. 4 illustrates a 3D SFET structure 400, according to an embodiment. The SFET structure 400 may include a first transistor structure having a first S/D region 402 and a second S/D region 404 and a second transistor structure having a third S/D region 406 and a fourth S/D region 408. The second S/D region 404 may form a base region which may also include an emitter electrode 410, and the fourth S/D region 408 may form a collector electrode. A surface of the emitter 410 (e.g., the top surface of the emitter 410)) may be substantially coplanar with a surface of the base region 404 (e.g., the top surface of the base region 404), such that contacts 412 and 414 (which may be similar to contacts 212 and 214) are connected to the emitter 410 and the base region 404 at substantially the same height. The second S/D region 404 may include a first side 450 and a second side 452 facing opposite to the first side 450. The fourth S/D region 408 may include a first side 454 and a second side 456 facing opposite to the first side 454. The first transistor structure may be merged with the second transistor structure, such that, as shown in FIG. 4, the second side 452 of the S/D region 404 may be merged with the first side 454 of the fourth S/D region 408. The 3D SFET structure 400 includes some similarities to the 3D SFET structure 200 and repeated descriptions will be omitted.

Furthermore, as is described with respect to the 3D SFET structure 200, the 3D SFET structure 400 arrangement/orientation may be reversed (e.g., the first transistor structure being positioned below the second transistor structure). In such embodiments, the first contact 412 may be a BSPDN contact that contacts the emitter 410, the second contact 414 may be a BSPDN that contacts the base region 404, and the third contact 416 may be an MOL contact that contacts the fourth S/D region 408 (i.e., the collector 408). That is, depending on the arrangement/orientation of the SFET structure 400, the contacts 412 and 414 may be either BSPDN contacts or MOL contacts. Furthermore, contact 416 may be a BSPDN contact when contacts 412 and 414 are MOL contacts, and contact 416 may be a MOL contact when contacts 412 and 414 are BSPDN contacts. However, the disclosure is not limited to these contact configurations.

As shown in FIG. 4, the fourth S/D region 408 is enlarged. As the size increases (e.g., increasing the epitaxial growth amount of silicon), no additional connection structure is needed to connect the base region 404 to the collector 408 or vice versa.

Figure 5:
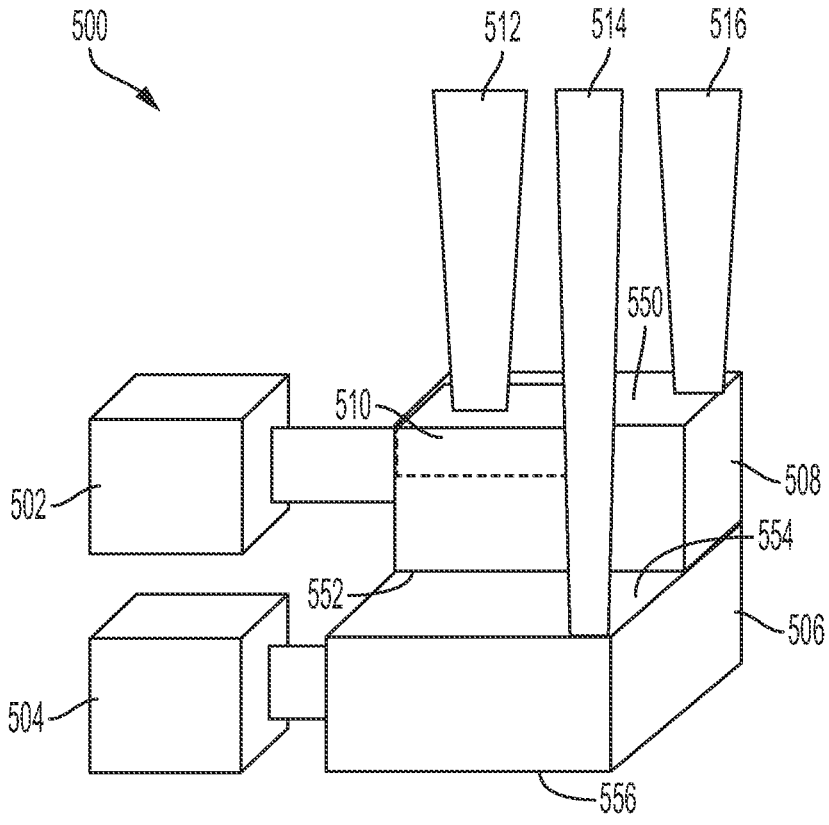
FIG. 5 illustrates a 3D SFET structure, according to an embodiment.

FIG. 5 illustrates a 3D SFET structure 500, according to an embodiment. The SFET structure 500 may include a first transistor structure having a first S/D region 502 and a second S/D region 504, and a second transistor structure having a third S/D region 506 and a fourth S/D region 508. The second S/D region 504 may form a base region which may include an emitter electrode 510, and the fourth S/D region 508 may form a collector electrode. The emitter electrode 510 may be formed by doping or implanting one or more p-type or n-type dopants on a portion of the second S/D region 504. A surface of the emitter 510 (e.g., a top surface of the emitter 510) may be substantially coplanar with a surface of the base region 504 (e.g., a top surface of the base region 504), such that contacts 512 and 514 (which may be similar to contacts 212 and 214) are connected to the emitter 510 and the base region 504 at substantially the same height. The second S/D region 504 may include a first side 550 and a second side 552 facing opposite to the first side 550. The fourth S/D region 508 may include a first side 554 and a second side 556 facing opposite to the first side 554. The first transistor structure may be merged with the second transistor structure, such that, as shown in FIG. 5, the second side 552 of the S/D region 504 may be merged with the first side 554 of the fourth S/D region 508. The 3D SFET structure 500 includes some similarities to the 3D SFET structure 200 and repeated descriptions will be omitted.

Furthermore, as is described with respect to the 3D SFET structure 200, the 3D SFET structure 500 arrangement/orientation may be reversed (e.g., the first transistor structure being positioned below the second transistor structure). In such embodiments, the first contact 512, the second contact 514, and the third contact 516 may extend in a direction opposite that which is depicted in FIG. 5, and may be any combination of BSPDN contacts and MOL contacts. However, the disclosure is not limited to these contact configurations.

As shown in FIG. 5, the fourth S/D region 508 may be extended laterally (or longitudinally) such that at least a portion of the fourth S/D region 508 is not overlapping with the second S/D region 504. That is, the fourth S/D region 508 may include a surface having a non-overlapping section 516 distinct from a portion of the surface of the fourth S/D region 508 that is overlapping with a surface of the second S/D region 504. Thus, the SFET 500 may be connected to a back-end-of-line (BEOL) structure through a contact 518, which may be an MOL structure extending from the BEOL structure to contact the non-overlapping section 516 of the surface of the fourth S/D region 508. This non-overlapping section 516 allows for easy connection to the contact 518 extending in a direction that is the same as the direction in which the contacts 512 and 514 extend.

Figure 6:
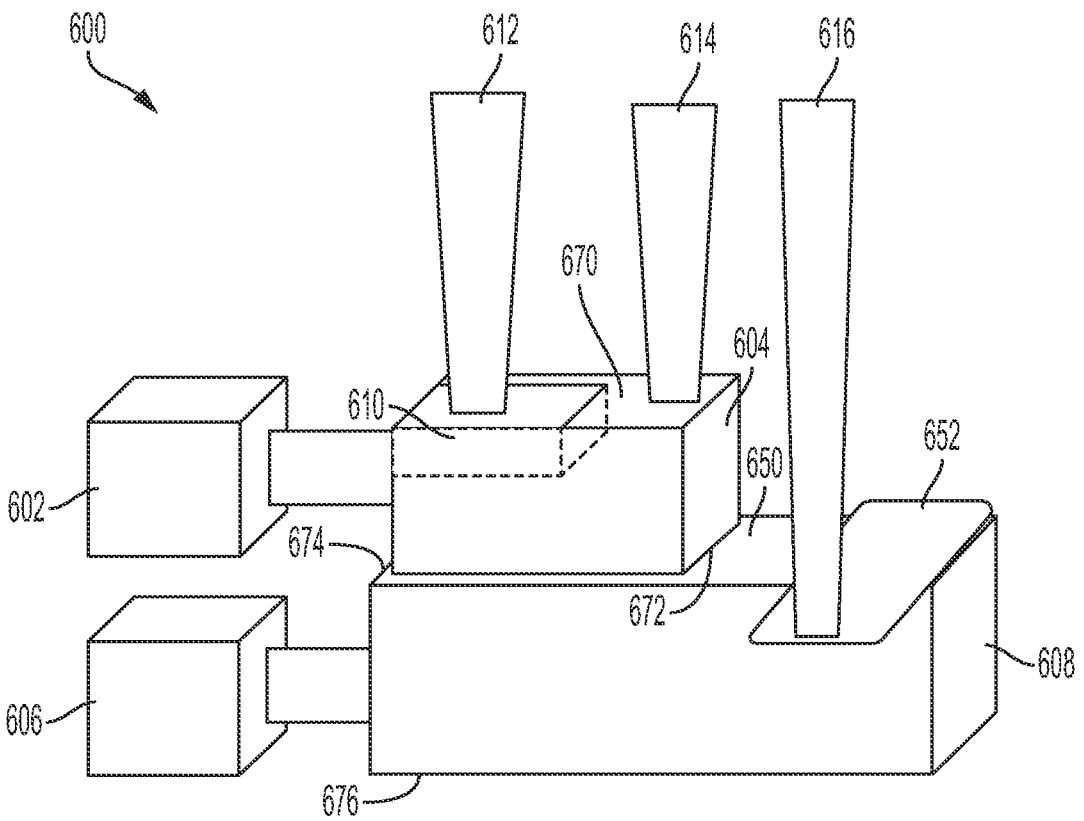
FIG. 6 illustrates a 3D SFET structure, according to an embodiment.

FIG. 6 illustrates a 3D SFET structure 600, according to an embodiment. The SFET structure 600 may include a first transistor structure having a first S/D region 602 and a second S/D region 604 and a second transistor structure having a third S/D region 606 and a fourth S/D region 608. The second S/D region 604 may form a base region which may include an emitter electrode 610, and the fourth S/D region 608 may form a collector electrode. The emitter electrode 610 may be formed by doping or implanting one or more p-type or n-type dopants on a portion of the second S/D region 604. A surface of the emitter 610 (e.g., a top surface of the emitter 610) may be substantially coplanar with a surface of the base region 604 (e.g., a top surface of the base region 604), such that contacts 612 and 614 (which may be similar to contacts 212 and 214) are connected to the emitter 610 and the base region 604 at substantially the same height. The second S/D region 604 may include a first side 670 and a second side 672 facing opposite to the first side 670. The fourth S/D region 608 may include a first side 674 and a second side 676 facing opposite to the first side 674. The first transistor structure may be merged with the second transistor structure, such that, as shown in FIG. 6, the second side 672 of the S/D region 604 may be merged with the first side 674 of the fourth S/D region 608. The 3D SFET structure 600 includes some similarities to the 3D SFET structure 200 and repeated descriptions will be omitted.

Furthermore, as is described with respect to the 3D SFET structure 200, the 3D SFET structure 600 arrangement/orientation may be reversed (e.g., the first transistor structure being positioned below the second transistor structure). In such embodiments, the first contact 612, the second contact

614, and the third contact 616 may extend in a direction opposite that which is depicted in FIG. 6, and may be any combination of BSPDN contacts and MOL contacts. However, the disclosure is not limited to these contact configurations.

As shown in FIG. 6, the fourth S/D region 608 is merged with the second S/D region 604, and the fourth S/D region 608 extends longitudinally past the second S/D region 604 in a channel-length direction, forming a non-overlapping section 650 distinct from a portion of the surface of the fourth S/D region 608 that is overlapping with a surface of the second S/D region 604. A metal shim 652 may be formed on the non-overlapping section 650 of the fourth S/D region 608, and a contact 654 may be formed on a surface of the metal shim 652, such that the metal shim 652 may laterally offset contact 654.

Thus, the 3D SFET 600 structure may be connected to a BEOL structure through the contact 654, which may be an MOL structure extending from the BEOL structure to land on the non-overlapping section 650 of the surface of the fourth S/D region 608. Although the fourth S/D region 608 is depicted as extending longitudinally from the third S/D region 606 (e.g., in a direction that is parallel to a channel direction in which the third S/D region 606 extends), the fourth S/D region 608 may extend in a direction that is perpendicular with respect to the third S/D region 606 (e.g., extending laterally as shown in FIG. 5). In one embodiment, the contact 654 may be configured to contact the non-overlapping section 650 directly (i.e., the contact 654 does not contact the metal shim 652). In another embodiment, the metal shim 652 may be used to offset the contact 654 in a preferred direction (e.g., laterally, longitudinally, etc.). Thus, the metal for connecting the fourth S/D region 608 is formed in the transistor, and the metal for connecting the emitter 610 and collector is formed in the BJT. In the case of a diode, the channel region in the transistor and the S/D regions on one side may be connected and used.

Although the embodiments depicted in FIGS. 2-6 illustrate a 3D SFET structure where a second S/D region (including a base region) is formed on top of a fourth S/D region (including a collector), the embodiments disclosed herein are not limited to such configurations. For example, the SFET structure may be reversed, where the fourth S/D region (e.g., the collector) is merged on top of the second S/D region (e.g., the base region and, in some embodiments, the emitter), where the fourth S/D region includes a contact on a top surface, and the second S/D region includes contacts at the bottom surface thereof. In such embodiments, the first S/D region and the third S/D region may also be reversed. Further, the 3D SFET device in such a configuration may be connected to a BSPDN by one or more contacts provided at the bottom surface of the second S/D region.

Figure 7:
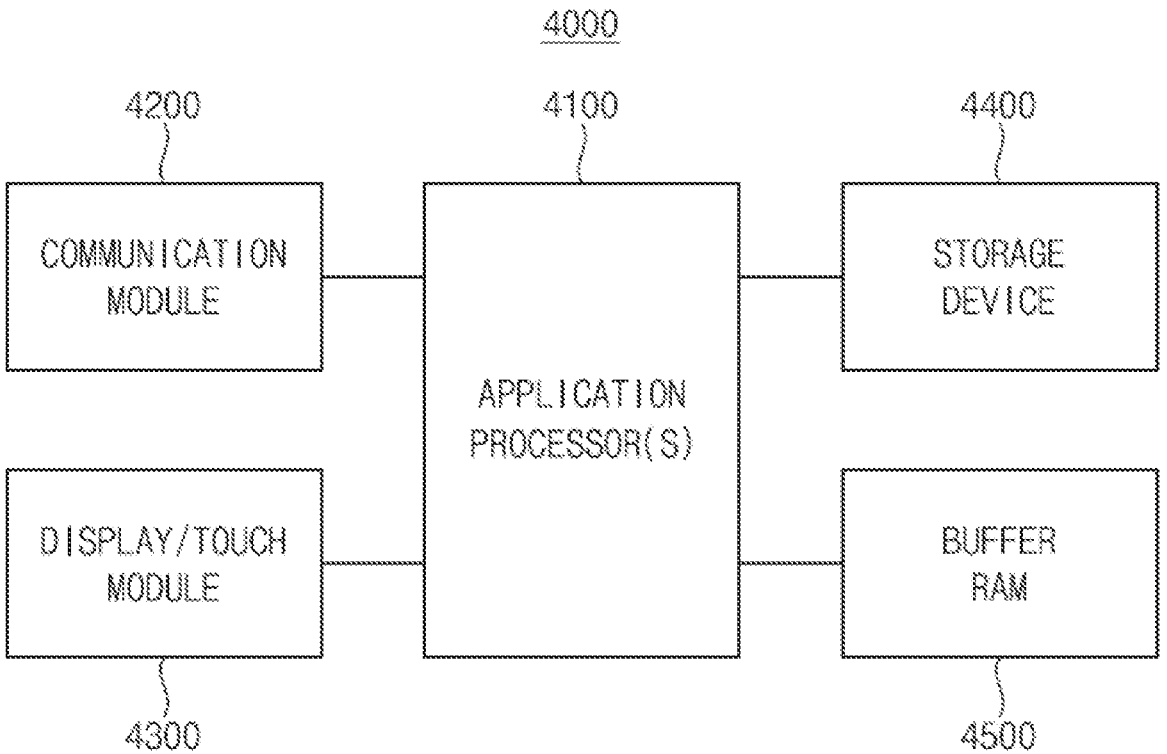
FIG. 7 is a schematic block diagram illustrating an electronic device including a semiconductor device in which the structure of at least one of the embodiments described in FIGS. 2-6, respectively, is used, according to an example embodiment.

FIG. 7 is a schematic block diagram illustrating an electronic device including a semiconductor device in which the structure of at least one of the embodiments described in FIGS. 2-6, respectively, is used, according to an example embodiment.

Referring to FIG. 7, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 may be implemented to perform wireless or wire communications with an external device. The display/touch module 4300 may be implemented to display data processed by the application processor 4100 and/or to receive data through a touch panel. The storage device 4400 may be implemented to store user data. The storage device 4400 may be an embedded multimedia card (eMMC), a solid state drive (SSD), a universal flash storage (UFS) device, etc., not being limited thereto. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), ferroelectric RAM (FeRAM), etc.

At least one component in the electronic device 4000 may include at least one of the structures shown in FIGS. 2-6, respectively, according to embodiments.

The foregoing is illustrative of example embodiments and is not to be construed as limiting the disclosure. Although a number of example embodiments have been described, those skilled in the art will readily appreciate that many modifications are possible in the above embodiments without materially departing from the disclosure.

What is claimed is:

1. A three-dimensional (3D) stacked field effect transistor (SFET) device, comprising:

a first transistor structure comprising a first source/drain (S/D) region and a second S/D region, the second S/D region comprising a first side and a second side facing opposite to the first side; and a second transistor structure comprising a third S/D region and a fourth S/D region, the fourth S/D region comprising a first side and a second side facing opposite to the first side, wherein the first transistor structure and the second transistor structure are merged such that the second side of the second S/D region is directly merged with the first side of the fourth S/D region.

2. The 3D SFET device of claim 1, wherein the fourth S/D region comprises a collector electrode.

3. The 3D SFET device of claim 1, wherein the second S/D region comprises a base region and an emitter electrode.

4. The 3D SFET device of claim 3, wherein a first surface of the base region is substantially coplanar with a first surface of the emitter electrode, wherein the first surface of the base region and the first surface of an electrode face of the emitter electrode opposite to a surface of the second side of the second S/D region.

5. The 3D SFET device of claim 1, further comprising an emitter electrode positioned in a channel of the first transistor structure and outside of the second S/D region.

6. The 3D SFET device of claim 5, wherein the second S/D region comprises a base region, wherein a first surface of the base region is substantially coplanar with a first surface of the emitter electrode, and wherein the first surface of the base region and the first surface of an electrode face of the emitter electrode opposite to a surface of the second side of the second S/D region.

7. The 3D SFET device of claim 1, wherein the first side of the fourth S/D region comprises:

an overlapping section that is merged with the second side of the second S/D region, and a non-overlapping section.

8. The 3D SFET device of claim 7, wherein the 3D SFET device is connected to a backside power distribution network (BSPDN) by a contact provided on the non-overlapping section of the fourth S/D region.

9. The 3D SFET device of claim 7, wherein the non-overlapping section extends in a longitudinal direction with respect to the third S/D region.

10. The 3D SFET device of claim 7, further comprising a metal shim formed on the non-overlapping section of the fourth S/D region.

11. The 3D SFET device of claim 10, further comprising a contact provided on the metal shim.

12. The 3D SFET device of claim 1, wherein the second S/D region is larger than the fourth S/D region.

13. The 3D SFET device of claim 1, further comprising:

a first contact provided on the first side of the second S/D region;

a second contact provided on the first side of the second S/D region; and a third contact provided on a second side of the fourth S/D region.

14. The 3D SFET device of claim 13, wherein the 3D SFET device is connected to a backside power distribution network (BSPDN) by at least one of the first contact, the second contact, and the third contact.

15. The 3D SFET device of claim 1, wherein the first S/D region is connected to the second S/D in a first direction, the third S/D region is connected to the fourth S/D region in the first direction, and the second side of the second S/D region is merged with the first side of the fourth S/D region in a second direction different from the first direction.

16. A three-dimensional (3D) stacked field effect transistor (SFET) device, comprising:

a first transistor structure comprising a first source/drain (S/D) region and a second S/D region, wherein the second S/D region comprises:

a first side, a second side facing opposite to the first side, a base region, and an emitter electrode; and a second transistor structure comprising a third S/D region and a fourth S/D region, the fourth S/D region comprising a first side and a second side facing opposite to the first side, wherein the first transistor structure and the second transistor structure are merged such that the second side of the second S/D region is merged with the first side of the fourth S/D region, wherein a first surface of the base region is substantially coplanar with a first surface of the emitter electrode, and wherein the first surface of the base region and the first surface of an electrode face of the emitter electrode opposite to a surface of the second side of the second S/D region.

17. The 3D SFET device of claim 16, wherein the first side of the fourth S/D region comprises:

an overlapping section that is merged with the second side of the second S/D region, and a non-overlapping section.

18. The 3D SFET device of claim 17, further comprising a contact provided on the non-overlapping section.

19. The 3D SFET device of claim 16, further comprising:

a first contact provided on the first side of the second S/D region;

a second contact provided on the first side of the second S/D region; and a third contact provided on the second side of the fourth S/D region.

20. A three-dimensional (3D) stacked field effect transistor (SFET) device, comprising:

a first transistor structure comprising a first source/drain (S/D) region and a second S/D region, wherein the second S/D region comprises:

a first side, a second side facing opposite to the first side, a base region, and an emitter electrode; and a second transistor structure comprising a third S/D region and a fourth S/D region, wherein the fourth S/D region comprises:

a first side, a second side facing opposite to the first side, and a collector electrode, wherein the first transistor structure and the second transistor structure are merged such that the second side of the second S/D region is merged with the first side of the fourth S/D region, wherein the fourth S/D region further comprises:

an overlapping section that is merged with the second side of the second S/D region;

a non-overlapping section; and a metal shim provided on the non-overlapping section.

21. The 3D SFET device of claim 20, further comprising:

a first contact provided on a first surface of the base region;

a second contact provided on the first surface of the base region; and a third contact provided on a first surface of the metal shim.

\* \* \* \* \*